United States Patent [19]

Ueno

[11] Patent Number: 5,075,579
[45] Date of Patent: Dec. 24, 1991

[54] LEVEL SHIFT CIRCUIT FOR ACHIEVING A HIGH-SPEED PROCESSING AN AN IMPROVED OUTPUT CURRENT CAPABILITY

[75] Inventor: Masaji Ueno, Tokyo, Japan

[73] Assignee: Kabushiki Kaisha Toshiba, Kawasaki, Japan

[21] Appl. No.: 580,559

[22] Filed: Sep. 11, 1990

[30] Foreign Application Priority Data

Sep. 13, 1989 [JP] Japan .................................. 1-237456

[51] Int. Cl.$^5$ ................. H03K 19/092; H03K 19/094; H03K 19/01; H03K 17/04
[52] U.S. Cl. .................................... 307/475; 307/446; 307/264; 330/257
[58] Field of Search ............... 307/475, 446, 570, 264, 307/451, 448, 455, 270; 330/253, 257

[56] References Cited

U.S. PATENT DOCUMENTS

| | | | |
|---|---|---|---|
| 4,379,267 | 4/1983 | Young | 330/253 |
| 4,563,601 | 1/1986 | Asano et al. | 307/475 |
| 4,697,109 | 9/1987 | Honma et al. | 307/475 |
| 4,797,583 | 1/1989 | Ueno et al. | 307/475 |

FOREIGN PATENT DOCUMENTS

| | | | |
|---|---|---|---|
| 0146910 | 7/1985 | European Pat. Off. | 307/475 |
| 0219867 | 4/1987 | European Pat. Off. | 307/455 |

OTHER PUBLICATIONS

IEEE Journal of Solid-State Circuits, vol. 23, No. 5, dated Oct. 1988, pp. 1036-1037 by Yang et al.

Primary Examiner—Edward P. Westin
Assistant Examiner—David R. Bertelson
Attorney, Agent, or Firm—Finnegan, Henderson, Farabow, Garrett, and Dunner

[57] ABSTRACT

A level shift circuit of the present invention includes an input differential pair of transistors, as an input circuit section, which are switchingly operated in accordance with the level of an input signal supplied from a preceding circuit. An output circuit section is composed of first and second emitter follower transistors. A third transistor has its current path connected at one end to an emitter of the first emitter follower transistor and makes an output level of the first emitter follower transistor at a predetermined level. A fourth transistor has its current path connected at one end to the other end of the reference potential and its gate electrode connected to an output terminal of the second emitter follower transistor and is driven by an output voltage of the second emitter follower transistor to allow an output level of the first emitter follower transistor to be shifted to a low level. An inverter is connected to the output of the first and second emitter follower transistors and comprised of a P- and N-channel transistors commonly connected at their adjacent current paths to each other. The inverter is operated in accordance with an output level of the first emitter follower transistor to allow an output level of the second emitter follower tansistor to be output from that common connection point.

4 Claims, 1 Drawing Sheet

LEVEL SHIFT CIRCUIT FOR ACHIEVING A HIGH-SPEED PROCESSING AN AN IMPROVED OUTPUT CURRENT CAPABILITY

BACKGROUND OF THE INVENTION

1. Field of the Invention

The present invention relates to a level shift circuit and, in particular, to a level shift circuit suitable for an integrated circuit device of an ECL-CMOS configuration.

2. Description of the Related Art

Of semiconductor IC devices, a bipolar complementary MOS (Bi-CMOS) structure is known generally as one of hybrid LSI's of analog/digital functions.

In an IC device of a Bi-CMOS configuration, an ECL-CMOS level shift circuit is sometimes inserted, for example, between an ECL (Emitter-Coupled-Logic) and a circuit of a CMOS configuration.

The level shift circuit is of such a type that, when an ECL signal cannot be input directly to the circuit of a CMOS configuration, the level shift circuit shifts that signal level to a predetermined level. In the level shift circuit, an emitter follower transistor for output is normally connected to a multi-input differential stage so that it operates at a non-saturated region.

The level shift circuit normally comprises a differential pair-transistor circuit section, an output transistor circuit section driven upon receipt of a drive signal from the differential pair-transistor circuit to shift that input signal level to a predetermined level, and so on.

In order to decrease a transmission delay time in the level shift circuit and achieve a high-speed processing throughout the whole circuit, a high-speed switching operation has to be achieved at the output transistor. Such a technique is performed normally by decreasing a capacitance of an output transistor, or the size of elements formed over a semiconductor substrate, and increasing a current by which the output transistor is driven. However, a decrease in capacitance of the output transistor results in a decreased output current capability of the level shift circuit. In order to increase a drive current of the output transistor, the output current of the differential pair transistor circuit can be increased, but it is necessary to increase a current by which the differential pair transistor circuit is driven.

In order to enhance an output current capability while maintaining a high-speed processing, it will be necessary to increase the size of the output transistor and hence to increase its drive current which is supplied as an output current from the differential-pair transistor circuit.

Further, the increase in the drive current and hence the output current results in an increase in dissipation power throughout the whole circuit and hence in quantity of heat evolved in the circuit itself. On the other hand, a decrease in dissipation current (dissipation power) of the circuit is required from another aspect to achieve a higher integration density or higher microminiaturization for a semiconductor circuit. If a low dissipation power circuit is to be achieved by decreasing the drive current and output current of each element, the transistor in the circuit as set out above is delayed in switching operation, involving a longer signal transmission delay time and decreasing an output current capability of the level shift circuit.

Even if the coming of an input signal is awaited at a standby time, a standby current needs to be flowed so as to effect a high-speed switching operation in the level shift circuit. If, in this case, such a standby current is to be decreased so as to decrease a dissipation current, then the output transistor becomes slower in switching operation to adversely affect a high/low (H/L) level difference.

SUMMARY OF THE INVENTION

It is accordingly the object of the present invention to provide a level shift circuit which can achieve a high-speed processing by decreasing a signal transmission delay time without decreasing a dissipation power (dissipation current) and can improve an output current capability.

According to the present invention there is provided a level shift circuit for achieving a high-speed processing and an improved output current capability, comprising:

an input differential pair of transistors switchingly operated in accordance with a level of an input signal;

first and second emitter follower transistors for receiving an output of the transistors in input differential pair;

a third transistor having its current path connected at one end to an emitter of the first emitter follower transistor and making an output level of the first emitter follower transistor at a predetermined level;

a fourth transistor having its current path connected at one end to the other end of the third transistor and at the other end to a reference potential and its control electrode connected to an output terminal of the second emitter follower transistor and driven by an output voltage of the second emitter follower transistor to allow an output level of the first emitter follower transistor to be shifted to a low level; and inverter means operated in accordance with an output level of the first emitter follower transistor and having a P- and an N-channel transistor commonly connected at their adjacent current paths to each other to allow an output level of the second emitter follower transistor to be output as an inverted level from that common connection point.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

One embodiment of the present invention will be explained below with reference to the accompanying drawings.

Figure 1:
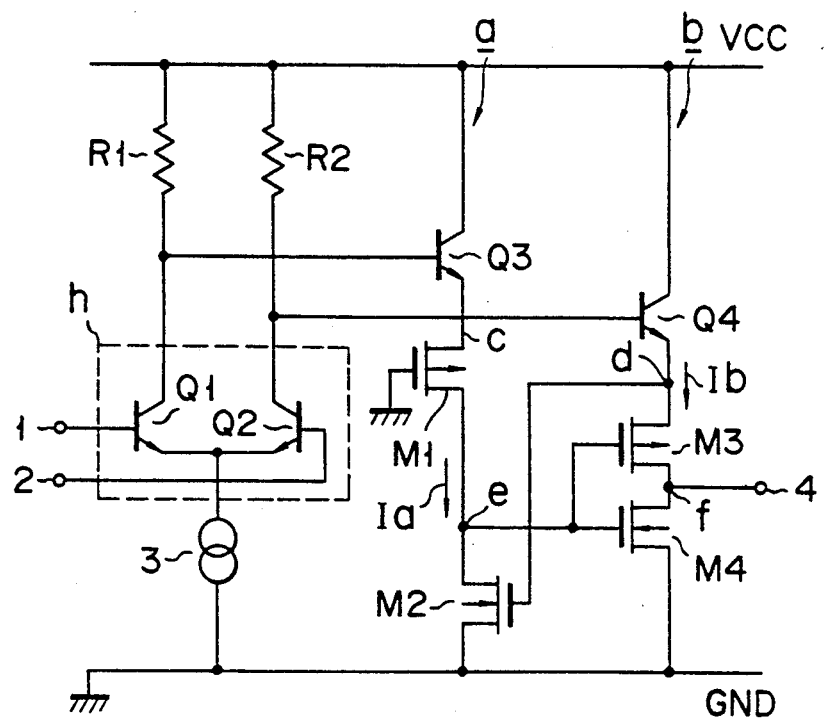
FIG. 1 is a circuit diagram showing an ECL-CMOS level shift circuit according to one embodiment of the present invention.

FIG. 1 is a circuit arrangement showing an ECL-CMOS level circuit according to a first embodiment of the present invention.

In the level circuit shown in FIG. 1, a differential-pair of transistors Q1, Q2 are provided in which an input signal is supplied from an input terminal 1 to the base of the transistor Q1 and a reference potential is supplied from an input terminal 2 to the base of the transistor Q2. The collectors of the transistors Q1 and Q2 are connected respectively through resistors R1 and R2 to a power source VCC and the emitters of these transistors are connected to each other via a constant current source 3.

The collector of the transistor Q1 is connected to the base of an emitter follower transistor Q3 and the collector of the transistor Q2 is connected to the base of an emitter follower transistor Q4. Upon receipt of the input signals, the transistors Q1 and Q2 in that differential pair deliver their output signals to the emitter follower transistors Q3 and Q4, driving these transistors Q3 and Q4.

The transistor Q3 has its collector connected to the power source VCC and its emitter connected to the source of a grounded-gate, P channel MOS transistor M1. The drain of the P channel MOS transistor M1 is connected to that of an N channel MOS transistor M2. The MOS transistor M2 has a grounded source and a gate connected to the emitter of the transistor Q4.

The transistor Q4 has its collector connected to the power source VCC and its emitter connected to the source of a P channel MOS transistor M3. The drain the transistor M3 is connected to that of an N channel transistor M4. The MOS transistors M3 and M4 constitute an inverter circuit.

The gates of the transistors M3 and M4 are commonly connected to a connection point between the transistors M3 and M4. The drain of the transistors M3 and M4 are connected to a common connection point which is connected to an output terminal 4.

The operation of the level shift circuit will be explained below with reference to voltage waveforms at predetermined circuit points. The voltage waveforms show voltage levels of the respective transistors at measuring points c to f shown in FIG. 1. The transistors Q3 and Q4 are turned ON and OFF, respectively, when they receive corresponding differential input signals switchingly supplied from the transistors Q3 and Q4. In this case, a current Ia flows along a line a as shown in FIG. 1. A "H" level signal appears on a measuring point c on the line a and the transistor M1 is turned ON to allow a "H" level signal to emerge on the measuring point e.

If, in this case, the transistor Q4 is turned OFF, the transistors M3 and M4 ar turned ON upon receipt of the "H" level signal on the measuring point c so that a "L" level output appears from the CMOS inverter at the measuring point f.

As a result, a "L" level signal emerges on the measuring point d connected to the gate of the transistor M2 and a gate/drain voltage $V_{GS}$ of the transistor M2 emerges as a "L" level one.

As will be appreciated from the above, the level shift circuit is of such a type as to achieve a high-speed switching operation using a standby current. In an usual case, a "L" level voltage is used as a standby level instead of a "H" level one, whereby a drain current is reduced and hence a current Ia on the connection line a is reduced.

With the transistor Q3 OFF and the transistor Q4 ON, a "L" level voltage appears on the measuring point c and a current Ib flows along a connection line b as shown in FIG. 1.

A "H" level voltage emerges on the measuring point d and the transistor M2 is turned ON so that a voltage on the measuring point e goes toward a ground level. Put it in another way, a rise voltage Vth on the transistor M4 drops by an extent corresponding to a drain/ground voltage on the transistor M2 and the output of the CMOS inverter at the measuring point f goes high.

Figure 2:
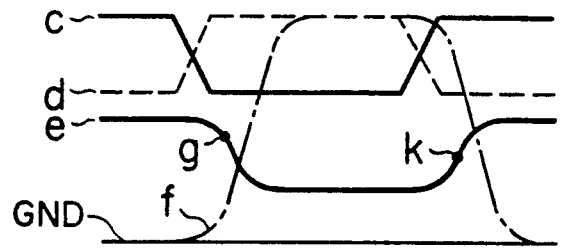
FIG. 2 shows voltage waveforms at specific points in the level shift circuit shown in FIG. 1.

As will be appreciated from the above, rise voltages Vth (g, k in FIG. 2) on the transistors M3 and M4 vary upon receipt of the input signal switchingly delivered from the transistors in differential pair. It is thus possible to maintain a transmission delay time even if a current Ia at the standby time is reduced.

Figure 3:
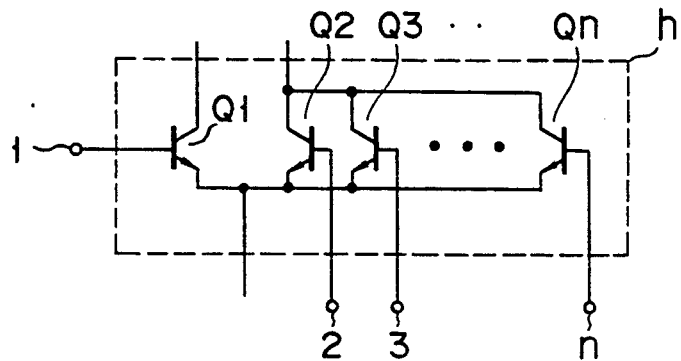
FIG. 3 shows a differential input circuit responsive to a plurality of input signals, which is used in place of a differential-pair transistor input circuit in the level shift circuit shown in FIG. 1.

As indicated by an input circuit section in FIG. 3, a plurality of transistors Q1, Q2, Q3 . . . Qn can be constructed, instead of the differential pair of transistors Q1, Q2 as enclosed by a broken line in FIG. 1, to supply corresponding input signals to associated circuits.

According to the present invention, as set out above, the inverter circuit is added to the output circuit section, achieving a decreased transmission delay time and hence a high-speed processing.

Since a high-speed switching operation is achieved by a standby current supplied to the output transistors and a combination of an emitter follower configuration and transistor operated by an opposite-phase current, a standby current normally flowing at the time of standby is shifted to a low level one, whereby it is possible to achieve a low dissipation power.

Thus the output current capability of the output transistor can be improved with the use of the saved dissipation power, that is, the output current capability is improved by utilizing a saved dissipation power for an output transistor now possible to increase in size for a reason as set out above.

Even if the output transistor is increased in size, a quantity of heat evolved is not increased since other circuit elements dissipate less electric power.

As will be understood from the above, the level shift circuit of the present invention can achieve a decreased transmission delay time and hence a high-speed processing and achieve an improved output current capability and hence a reduced dissipation power.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A level shift circuit for achieving a high-speed processing and an improved output current capability, comprising:

an input differential pair of transistors switchingly operated in accordance with a level of an input signal;

first and second emitter follower transistors for receiving an output of the transistors in input differential pair;

a third transistor having its current path connected at one end to an emitter of the first emitter follower transistor and making an output level of the first emitter follower transistor at a predetermined level;

a fourth transistor having its current path connected at one end to the other end of the third transistor and at the other end to a reference potential and its control electrode connected to an output terminal of the second emitter follower transistor and driven by an output voltage of the second emitter follower transistor to allow an output level of the first emitter follower transistor to be shifted to a low level; and inverter means operated in accordance with an output level of the first emitter follower transistor and having a P- and an N-channel transistor commonly connected at their adjacent current paths to each other to allow an output level of the second emitter follower transistor to be output as an inverted level from that common connection point.

2. The level shift circuit according to claim 1, wherein said P- and N-channel transistors constituting said inverter means are of a MOS structure to allow achievement of a high-speed processing and an improved output current capability.

3. The level shift circuit according to claim 1, wherein said inverter means performs an inverting operation, by an opposite-phase current, against an operation of an emitter follower transistor configuration.

4. A level shift circuit for achieving a high-speed speed processing and an improved output current capability, comprising:

an input differential set of transistors switchingly operated in accordance with levels of a plurality of input signals;

first and second emitter follower transistors for receiving an output of the transistors in the input differential set;

a third transistor having its current path connected at one end to an emitter of the first emitter follower transistor and making an output level of the first emitter follower transistor at a predetermined level;

a fourth transistor having its current path connected at one end to the other end of the third transistor and at the other end to a reference potential and its control electrode connected to an output terminal of the second emitter follower transistor and driven by an output voltage of the second emitter follower transistor to allow an output level of the first emitter follower transistor to be shifted to a low level; and inverter means operated in accordance with an output level of the first emitter follower transistor and having a P- and N-channel transistor commonly connected at their adjacent current paths to each other to allow an output level of the second emitter follower transistor to be output as a inverted level from that common connection point.

* * * * *

UNITED STATES PATENT AND TRADEMARK OFFICE
CERTIFICATE OF CORRECTION

PATENT NO. : 5,075,579
DATED : December 24, 1991
INVENTOR(S) : Masaji Ueno

It is certified that error appears in the above-identified patent and that said Letters Patent is hereby corrected as shown below:

On the title page, and col. 1, line 1:
Title, change "AN AN" to --AND AN--.

Abstract, line 19, after "a P- and" insert --an--.

Abstract, line 23, change "tansistor" to --transistor--.

Claim 4, column 6, line 4, before "processing" delete "speed"

Claim 4, column 6, line 32, after "as" change "a" to --an--.

Signed and Sealed this

Third Day of August, 1993

Attest:

MICHAEL K. KIRK

*Attesting Officer*    Acting Commissioner of Patents and Trademarks